(12) United States Patent
Fujisawa et al.

(10) Patent No.: US 6,813,001 B2
(45) Date of Patent: Nov. 2, 2004

(54) EXPOSURE METHOD AND APPARATUS

(75) Inventors: Tadahito Fujisawa, Tokyo (JP); Masafumi Asano, Yokohama (JP); Tatsuhiko Higashiki, Fujisawa (JP)

(73) Assignee: Kabushiki Kaisha Toshiba, Tokyo (JP)

(*) Notice: Subject to any disclaimer, the term of this patent is extended or adjusted under 35 U.S.C. 154(b) by 26 days.

(21) Appl. No.: 10/283,252

(22) Filed: Oct. 30, 2002

(65) Prior Publication Data

US 2003/0090640 A1 May 15, 2003

(30) Foreign Application Priority Data

Nov. 2, 2001 (JP) ........................................ 2001-338169

(51) Int. Cl.⁷ ..................... G03B 27/42; G03B 27/52; G03B 27/68
(52) U.S. Cl. ................... 355/53; 355/52; 355/55
(58) Field of Search ............................ 355/52, 53, 55

(56) References Cited

U.S. PATENT DOCUMENTS

| | | | |
|---|---|---|---|
| 6,262,792 B1 | 7/2001 | Higashiki | |
| 6,310,680 B1 | 10/2001 | Taniguchi | |
| 6,333,776 B1 * | 12/2001 | Taniguchi | ................ 355/52 |
| 6,522,386 B1 * | 2/2003 | Nishi | ........................ 355/52 |
| 6,549,271 B2 * | 4/2003 | Yasuda et al. | ............. 355/55 |
| 2002/0171815 A1 * | 11/2002 | Matsuyama et al. | ...... 355/55 |

FOREIGN PATENT DOCUMENTS

| | | |
|---|---|---|
| JP | 9-167736 | 6/1997 |
| JP | 10-172901 | 6/1998 |

* cited by examiner

*Primary Examiner*—Rodney Fuller
(74) *Attorney, Agent, or Firm*—Finnegan, Henderson, Farabow, Garrett & Dunner, L.L.P.

(57) ABSTRACT

An exposure method comprising measuring a position distribution, in an optical axis direction of the optical system, on a measurement area surface of the wafer which is not irradiated with the exposure light, computing a tilt component and a curved component of the measurement area surface on the basis of the measured position distribution, obtaining a leveling amount by which the measurement area surface is made to become orthogonal to the optical axis direction, on the basis of the tilt component, obtaining an adjustment amount for an imaging characteristic of the optical system on the basis of the curved component, and irradiating the measurement area with the exposure light on the basis of the obtained leveling amount and adjustment amount while the measurement area surface and the imaging characteristic are adjusted.

19 Claims, 7 Drawing Sheets

EXPOSURE METHOD AND APPARATUS

CROSS-REFERENCE TO RELATED APPLICATIONS

This application is based upon and claims the benefit of priority from the prior Japanese Patent Application No. 2001-338169, filed Nov. 2, 2001, the entire contents of which are incorporated herein by reference.

BACKGROUND OF THE INVENTION

1. Field of the Invention

The present invention particularly relates to an exposure method which is suitably performed under optimal focus conditions, an exposure apparatus, and a method of manufacturing a semiconductor apparatus in the manufacture of semiconductor elements, liquid crystal display apparatus, and the like.

2. Description of the Related Art

Recently, as an apparatus capable of reducing the diameter of a projection lens and the like, an exposure apparatus based on a scan exposure scheme (to be referred to as a scan exposure apparatus hereinafter) designed to perform exposure by moving a reticle and semiconductor wafer in opposite directions has been developed.

Figure 11:
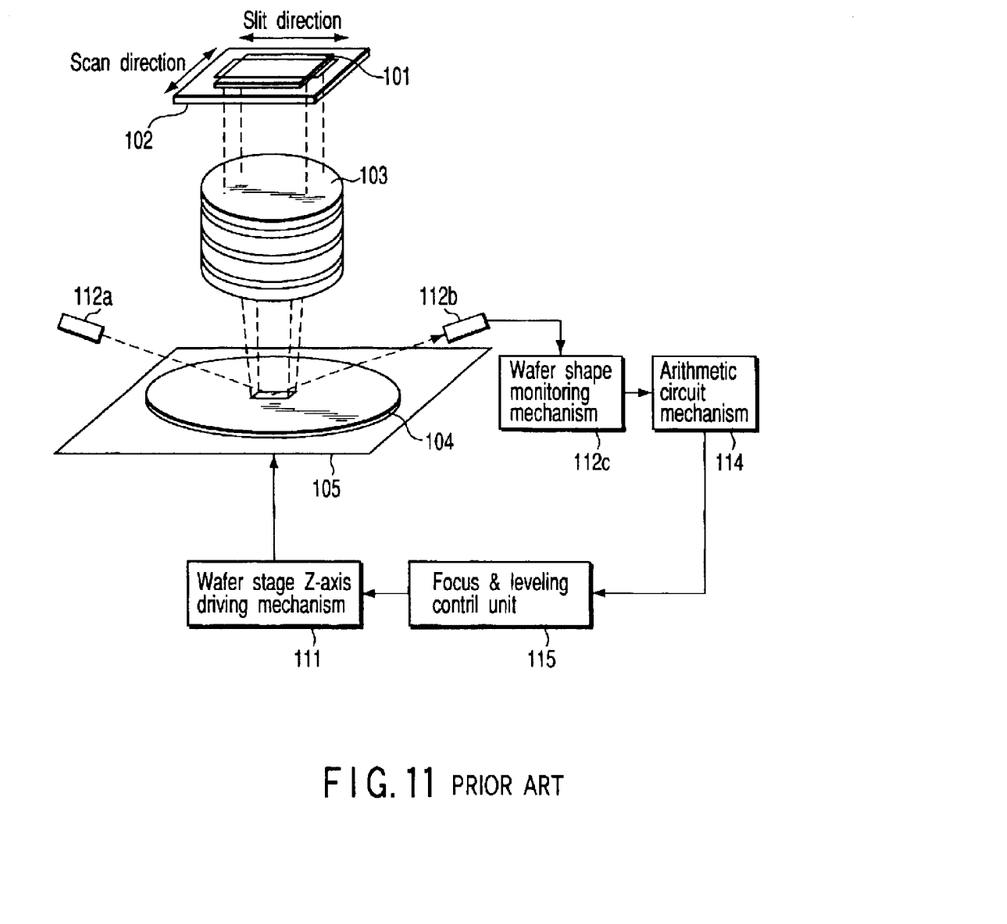
FIG. 11 is a view showing the schematic arrangement of a conventional scan exposure apparatus.

A focus control method in a scan exposure apparatus will be described with reference to FIG. 11. The uneven shape of the surface of a semiconductor wafer 104 to be exposed in an exposure area of the semiconductor wafer 104 is monitored in advance by a look-ahead focus sensor 112 (112a, 112b, and 112c). An arithmetic circuit mechanism 114 calculates a proper focus plane and tilt amount in the slit and scan directions from the monitoring result. Conventionally, scan exposure is performed while a semiconductor wafer stage 105 is tilted by a semiconductor wafer stage Z-axis driving mechanism 111 on the basis of the calculated focus plane and tilt amount. That is, the tilt of the semiconductor wafer with respect to the focus plane is corrected. Referring to FIG. 11, reference numeral 101 denotes a reticle; 102, a reticle stage; and 103, a projection lens.

Figure 3A:
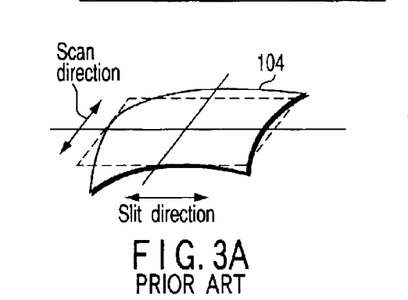
FIGS. 3A to 3C are views for explaining a case wherein a semiconductor wafer having a curved component is exposed by a conventional exposure method.
Figure 3B:
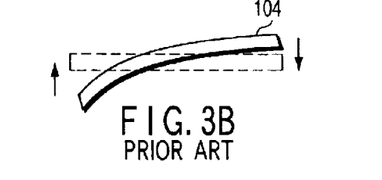
Figure 3C:
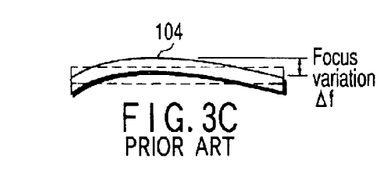
Figure 12A:
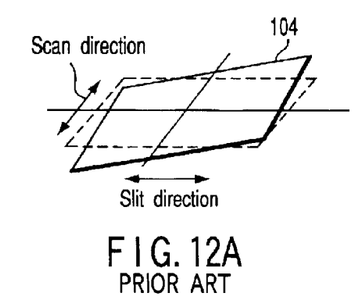
FIGS. 12A to 12C are views for explaining a case wherein a semiconductor wafer having no curved component is exposed by the conventional exposure method.
Figure 12B:
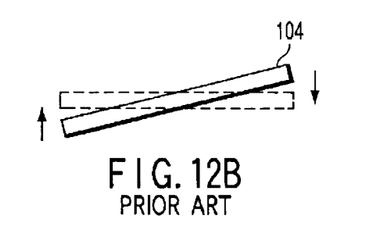
Figure 12C:
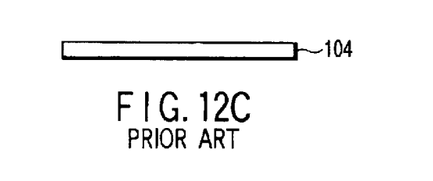

FIGS. 12A to 12C and 3A to 3C show cases wherein the above focus control method is applied to semiconductor wafer surfaces. FIGS. 12a to 12C are views for explaining a case wherein a semiconductor wafer having no second- or higher-order component is exposed by using a conventional exposure method. FIGS. 3A to 3C are views for explaining a case wherein a semiconductor wafer having a second- or higher-order component is exposed by using the conventional exposure method.

With regard to the relationship between a semiconductor wafer surface (solid line) and the focus plane (dotted line) of the apparatus, if there is only a first-order component in the scan and slit directions (FIG. 12A), the semiconductor wafer plane is aligned with the focus plane by conventional correction (FIG. 12B). As a result, as shown in FIG. 12C, exposure is performed while the semiconductor surface remains unchanged with respect to the focus plane.

In practice, however, as shown in FIG. 3A, a second- or higher-order component, other than a first-order component, inevitably exists due to the influences of the flatness of a semiconductor wafer and aberration of the exposure apparatus. As shown in FIG. 3C, focus variations cannot be satisfactorily suppressed by only conventional correction in FIG. 3B.

This influence on a gently curved surface can be corrected in the scan direction in which the slit width is small, because correction is finely repeated in a scanning operation along the surface shape of the semiconductor wafer in the conventional method, as well. However, the influence on the curved portion in the slit direction cannot be corrected, and hence focus variations cannot be improved. This causes a deterioration in yield due to a focus error.

BRIEF SUMMARY OF THE INVENTION (1) According to an aspect of the present invention, there is provided an exposure method of performing scan exposure on an exposure area on a wafer by moving the wafer with respect to exposure light passing through an optical system in synchronism with movement of a reticle with respect to the exposure light, comprising:

measuring a position distribution, in an optical axis direction of the optical system, on a measurement area surface of the wafer which is not irradiated with the exposure light;

computing a tilt component and a curved component of the measurement area surface on the basis of the measured position distribution;

obtaining a leveling amount by which the measurement area surface is made to become orthogonal to the optical axis direction, on the basis of the tilt component;

obtaining an adjustment amount for an imaging characteristic of the optical system on the basis of the curved component; and irradiating the measurement area with the exposure light on the basis of the obtained leveling amount and adjustment amount while the measurement area surface and the imaging characteristic are adjusted.

(2) According to another aspect of the present invention, there is provided an exposure method of performing scan exposure on an exposure area on a wafer by moving the wafer with respect to exposure light passing through an optical system in synchronism with movement of a reticle with respect to the exposure light, comprising:

measuring a position distribution, in an optical axis direction of the optical system, on a measurement area surface of the wafer which is not irradiated with the exposure light;

computing a tilt component and curved component of the wafer surface on the basis of the position distribution on the wafer surface;

measuring a position distribution, in the optical axis direction, on a reticle surface of the reticle which is located on the optical system side;

computing a tilt component and a curved component of the reticle surface on the basis of the position distribution on the reticle surface;

obtaining a leveling amount by which the measurement area surface is made to become orthogonal to the optical axis, on the basis of the tilt component of the measurement area surface;

obtaining at least one of adjustment amounts for imaging characteristic of the optical system and the position of the reticle surface on the basis of curved components of the measurement area surface and the reticle surface; and irradiating the measurement area surface with the exposure light on the basis of the leveling amount and the adjustment amount while the measurement area surface and at least one of the imaging characteristic and the position of the reticle surface are adjusted.

(3) According to still another aspect of the present invention, there is provided an exposure apparatus comprising:

an optical system which projects a pattern image formed on a reticle onto a wafer;

a reticle stage on which the reticle is placed and which can move in a direction perpendicular to an optical axis direction of the optical system;

a wafer stage on which the wafer is placed and which can move in the optical axis direction of the optical system and a direction perpendicular to the optical axis direction;

wafer surface position measurement means configured to measure a position of the wafer surface in the optical axis direction of the optical system;

a computing mechanism which computes a tilt component and curved component of the wafer surface on the basis of the measurement value obtained by the wafer surface position measurement means;

adjustment means configured to adjust a position of the wafer in the optical axis direction of the optical system on the basis of the tilt component; and correction means configured to correct an imaging characteristic of the optical system on the basis of the curved component.

(4) According to still another aspect of the present invention, there is provided an exposure apparatus comprising:

an optical system which projects a pattern image formed on a reticle onto a wafer;

a reticle stage which can move in an optical axis direction of the optical system and a direction perpendicular to the optical axis direction;

a vertical movement mechanism which is mounted on the reticle stage and changes a position distribution on the reticle in the optical axis direction of the optical system;

a wafer stage on which the wafer is placed and which can move in the optical axis direction of the optical system and a direction perpendicular to the optical axis direction of the optical system;

wafer surface position measurement means configured to measure a position of a measurement area surface of the wafer in the optical axis direction of the optical system;

reticle surface position measurement means configured to measure a position of the reticle surface located on the optical system side in the optical axis direction;

a first computing mechanism which computes a tilt component and a curved component of the measurement area surface on the basis of the measurement result obtained by the wafer surface position measurement means;

a second computing mechanism which computes a curved component of the reticle surface on the basis of the measurement result obtained by the reticle surface position measurement means;

adjustment means configured to adjust a position of the wafer in the optical axis direction of the optical system on the basis of the tilt component computed by the first computing mechanism; and correction means configured to correct at least one of an imaging characteristic of the optical system and a position distribution on the reticle surface in the optical axis direction on the basis of the curved component computed by the first and second computing mechanisms.

DETAILED DESCRIPTION OF THE INVENTION

The embodiments of the present invention will be described below with reference to the several views of the accompanying drawing.

(First Embodiment)

The present invention has paid attention to the fact that a curved component in the slit direction which cannot be suppressed by tilt correction alone can be corrected by lens control using the aberration correction function of a projection lens.

Figure 1:
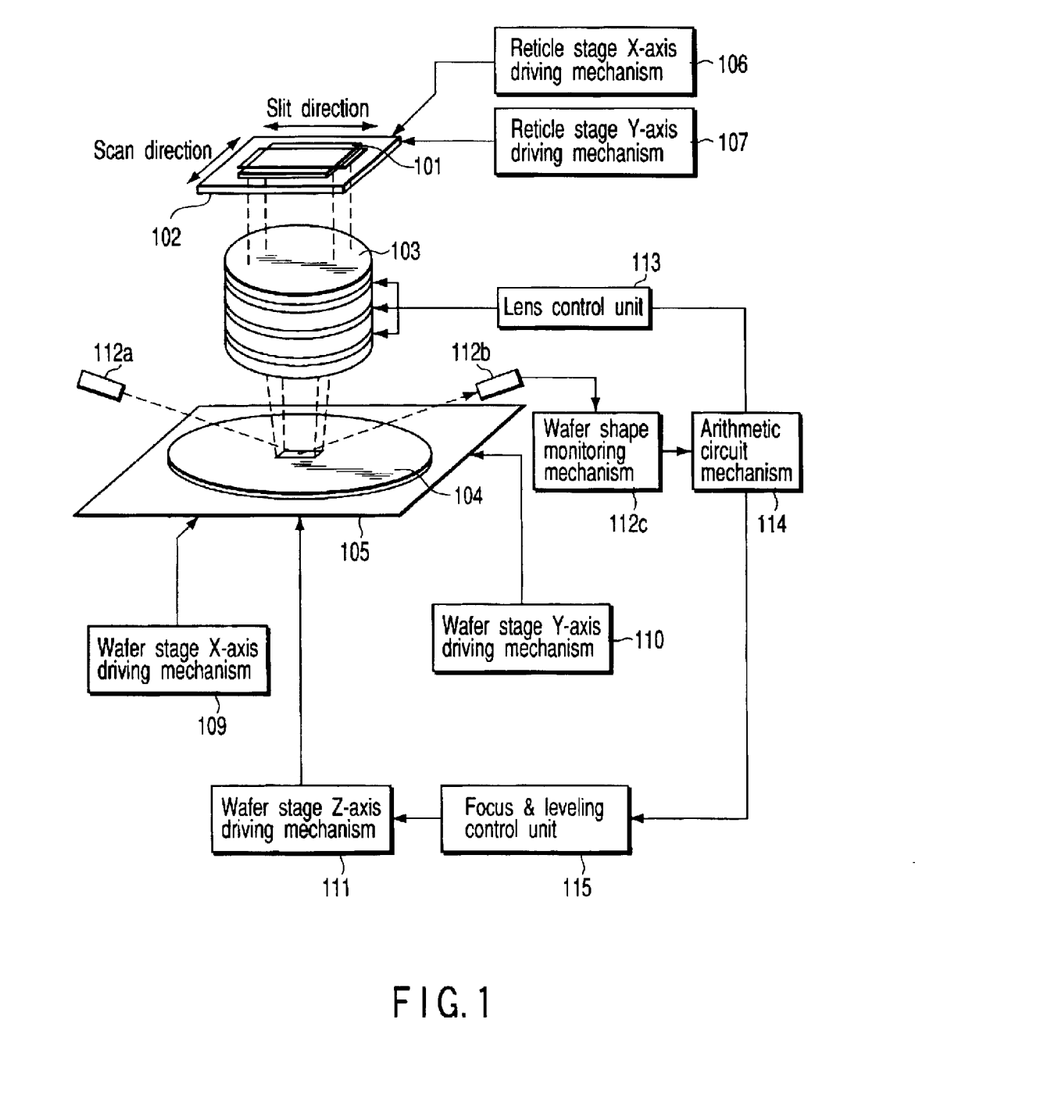
FIG. 1 is a view showing the schematic arrangement of an exposure apparatus according to the first embodiment.

FIG. 1 is a view showing the schematic arrangement of a reduction projection optical exposure apparatus which is a scan exposure apparatus according to the first embodiment of the present invention.

As shown in FIG. 1, a pattern on a reticle 101 placed on a reticle stage 102 is illuminated with a slit-like rectangular illumination area by an illumination optical system (not shown). The pattern image is projected/exposed on a semiconductor wafer 104 on the semiconductor wafer stage 105 via a projection lens 103. In this exposure operation, the semiconductor wafer 104 is scanned with respect to the slit-like illumination area in the scan direction in synchronism with constant-speed scanning of the reticle 101 in the scan direction.

At this time, when the reticle 101 and semiconductor wafer 104 move in the opposite directions, the entire pattern image formed on the surface of the reticle 101 which is located on the projection lens 103 side, i.e., the pattern surface, is projected on the exposure surface on the semiconductor wafer 104 upon being reduced at a predetermined magnification by the projection lens 103.

The exposure surface on the semiconductor wafer 104 is coated with a photoresist. The reduced pattern projected via the projection lens 103 is exposed on this photoresist.

The reticle 101 is placed on the reticle stage 102 which can move in the X-axis direction perpendicular to the optical axis direction of a light beam (the optical axis direction of the projection lens) and the Y-axis direction. The reticle stage 102 is moved in the X-axis direction, i.e., the scan direction, by a reticle stage X-axis driving mechanism 106. The reticle stage 102 is moved in the Y-axis direction by a reticle stage Y-axis driving mechanism 107.

The semiconductor wafer 104 is placed on the semiconductor wafer stage 105. The semiconductor wafer stage 105 can change its tilt angle with respect to the optical axis of a light beam. The semiconductor wafer stage 105 can also move in the X- and Y-axis directions perpendicular to the optical axis direction of a light beam and the Z-axis direction parallel to the optical axis direction of a light beam. The semiconductor wafer stage 105 is moved in the X-axis direction (scan direction) by a semiconductor wafer stage X-axis driving mechanism 109. The semiconductor wafer stage 105 is moved in the Y-axis direction (slit direction) by a semiconductor wafer stage Y-axis driving mechanism 110. Movement of the semiconductor wafer stage 105 in the Z-axis direction and a change in the tilt angle of the exposure surface are done by a semiconductor wafer stage Z-axis driving mechanism 111.

A look-ahead sensor 112 (112a, 112b, and 112c) monitors in advance the uneven shape of the surface of the semiconductor wafer 104 in the exposure area (measurement area) to be exposed. The look-ahead focus sensor 112 includes irradiators 112a for emitting illumination light at a plurality of positions in a measurement area surface in number sufficient to grasp a semiconductor wafer shape in the area to be exposed, and light-receiving units 112b which receive reflected light beams. The look-ahead focus sensor 112 further includes a semiconductor wafer shape monitoring mechanism 112c for measuring information about the height positions of the exposure surface of the semiconductor wafer at a plurality of positions on the measurement area surface, i.e., the positions of the exposure surface in the optical axis direction of the light beam (Z-axis direction), from signals representing the respective reflected light beams received by the light-receiving units 112b.

The projection lens 103 is constituted by a plurality of lens elements. Some of the plurality of lens elements are finely driven in the optical axis direction and tilt direction by driving elements (e.g., piezoelectric elements) (not shown). The drive voltage (drive amount) to each driving element is controlled by a lens control unit 113. The imaging characteristics, e.g., the curvature of field, distortion, and magnification, of the projection lens 103 are corrected in accordance with the drive amount of each driving element.

An arithmetic circuit mechanism 114 computes the least squares flat surface of the measurement area surface by least-squares approximating the data from the look-ahead focus sensor 112 with a first-order function. The arithmetic circuit mechanism 114 computes the least squares curved surface of the measurement area surface by least-squares approximating the data from the look-ahead focus sensor 112 with a second- or higher-order function.

The first-order term coefficient of the least squares flat surface is obtained as a tilt component. The 0th-order (constant term) of the least squares flat surface is obtained as an offset at the focus position. The second- or higher-order term coefficient of the least squares curved surface is obtained as a curved component.

The arithmetic circuit mechanism 114 computes a focus and leveling amount in the slit and scan directions from the obtained tilt component, and transfers them to a focus & leveling control unit 115.

The arithmetic circuit mechanism 114 obtains an aberration adjustment amount for the projection lens which is required to cancel out the obtained curved component and realize a state wherein the focus variation is minimized, and transfers it to the lens control unit 113. Note that the arithmetic circuit mechanism 114 may cancel out at least the curved component in the slit direction without canceling out the curved component in the scan direction.

Figure 2:
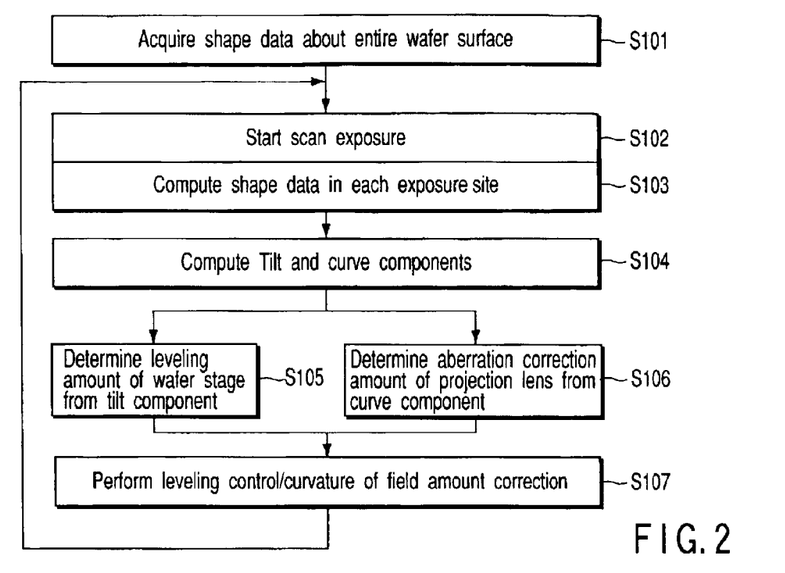
FIG. 2 is a flow chart for explaining an exposure method according to the first embodiment.

An exposure control method used by this exposure apparatus will be described with reference to the flow chart of FIG. 2.

(Step S101)

A slit-like exposure area on a reticle is irradiated with exposure light, and at the same time, the reticle 101 and semiconductor wafer 104 are moved to start scan exposure.

(Step S102)

First of all, semiconductor wafer shape data about a measurement area surface which is an exposure area is acquired by using the look-ahead focus sensor 112.

(Step S103)

The arithmetic circuit mechanism 114 obtains the least squares flat surface and least squares curved surface of the measurement area surface on the basis of the semiconductor wafer shape data about the measurement area surface acquired by the look-ahead focus sensor 112. The arithmetic circuit mechanism 114 then computes the tilt and curved components of the measurement area surface from the least squares flat surface and least squares curved surface.

The least squares flat surface is obtained by least-squares approximating the semiconductor wafer shape data about the measurement area surface with a first-order function. The least squares curved surface is obtained by least-squares approximating the semiconductor wafer shape data about the measurement area surface with a multi-order function.

Note that the measurement area surface may be approximated with a second- or higher-order function, and the first-order term coefficient and second- or subsequent-order term coefficient of the approximated function may be used as a tilt component and curved component, respectively.

(Step S104)

The arithmetic circuit mechanism 114 obtains the leveling amount of the semiconductor wafer stage 105 which is required for the separated tilt component to become orthogonal to the optical axis direction of the optical system so as to be perpendicular to the Z-axis.

(Step S105)

The arithmetic circuit mechanism 114 obtains an aberration adjustment amount for the projection lens 103 which is required to cancel out the computed curved component and realize a state wherein the focus variation is minimized. In this case, the curvature-of-field characteristics of the projection lens 103 are adjusted and corrected in a direction in which the value of the curved component of the measurement area surface of the semiconductor wafer 104 is canceled out. The curved component may be corrected in the slit direction.

(Step S106)

When the measurement area surface reaches the area to be exposed, the focus & leveling control unit 115 controls the semiconductor wafer stage Z-axis driving mechanism 111 on the basis of the computed leveling amount, and the lens control unit 113 corrects the curvature-of-field characteristics of the projection lens 103 on the basis of the computed aberration adjustment amount. Exposure is then performed.

At this time, the focus sensor 112 acquires semiconductor wafer shape data about the exposure area. The correction data obtained before exposure is further finely adjusted on the basis of the acquired data.

According to the conventional correction method, when a portion having a curved component is to be exposed, only tilt correction like that shown in FIG. 3B is executed. Since a curved component occupying the main part of focus variation cannot be corrected, a large focus variation residual is finally left, as shown in FIG. 3C.

Figure 4A:
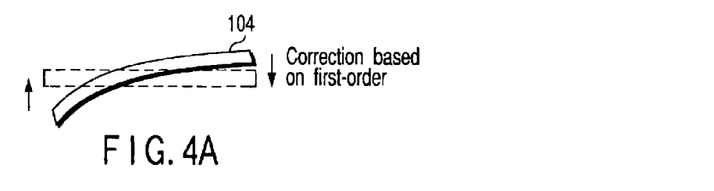
FIGS. 4A to 4C are views for explaining a case wherein a semiconductor wafer having a curved component is exposed by an exposure method according to the first embodiment.
Figure 4B:
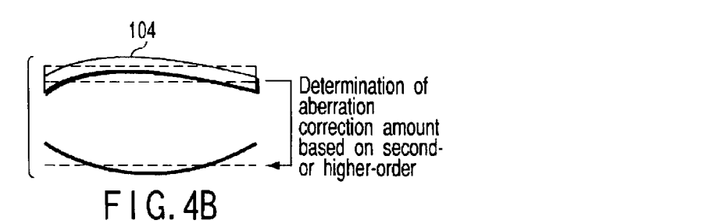
Figure 4C:
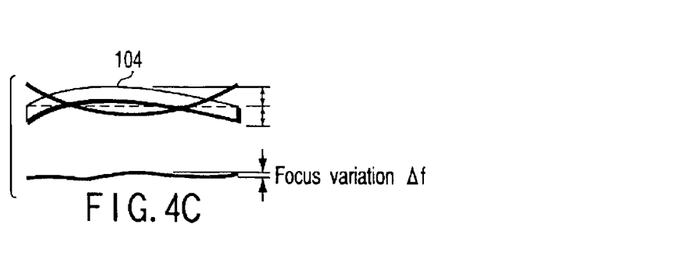

In contrast to this, according to this embodiment, the arithmetic circuit mechanism 114 computes a curved component as shown in FIG. 4B as well as performing conventional tilt correction (FIG. 4A). An aberration adjustment amount suitable for canceling out the curved component in the slit direction is determined on the basis of the curved component. The lens control unit 113 then executes aberration correction of the projection lens on the basis of this obtained aberration adjustment amount. As a result, as shown in FIG. 4C, the curved component is also properly corrected. This makes it possible to greatly reduce the effective focus variation on the semiconductor wafer surface.

In addition, correction can be done with higher precision if it is executed by obtaining the amount of curved component to be corrected and a corresponding aberration adjustment amount in consideration of not only the shape of the semiconductor wafer but also the residual curvature of field amount of the exposure apparatus.

By using the above method, as shown in FIGS. 4A to 4C, a second- or higher-order curved component which cannot be corrected in the prior art can be corrected, and a focus variation $\Delta f$ in the exposure area can be greatly reduced. This makes it possible to accurately obtain focus even on an area on a peripheral portion of a semiconductor wafer which cannot be used in the prior art because of poor semiconductor wafer flatness, thus achieving an increase in yield and a reduction in manufacturing cost.

This embodiment is based on a scan exposure apparatus, and tilt and curved components in the slit direction are corrected. However, similar correction can also be made in the scan direction, as needed. In addition, as far as a block exposure apparatus is concerned, effective operation can be done by performing aberration adjustment in both the X direction and the Y direction, and the same effects as those described above can be obtained.

Figure 5:
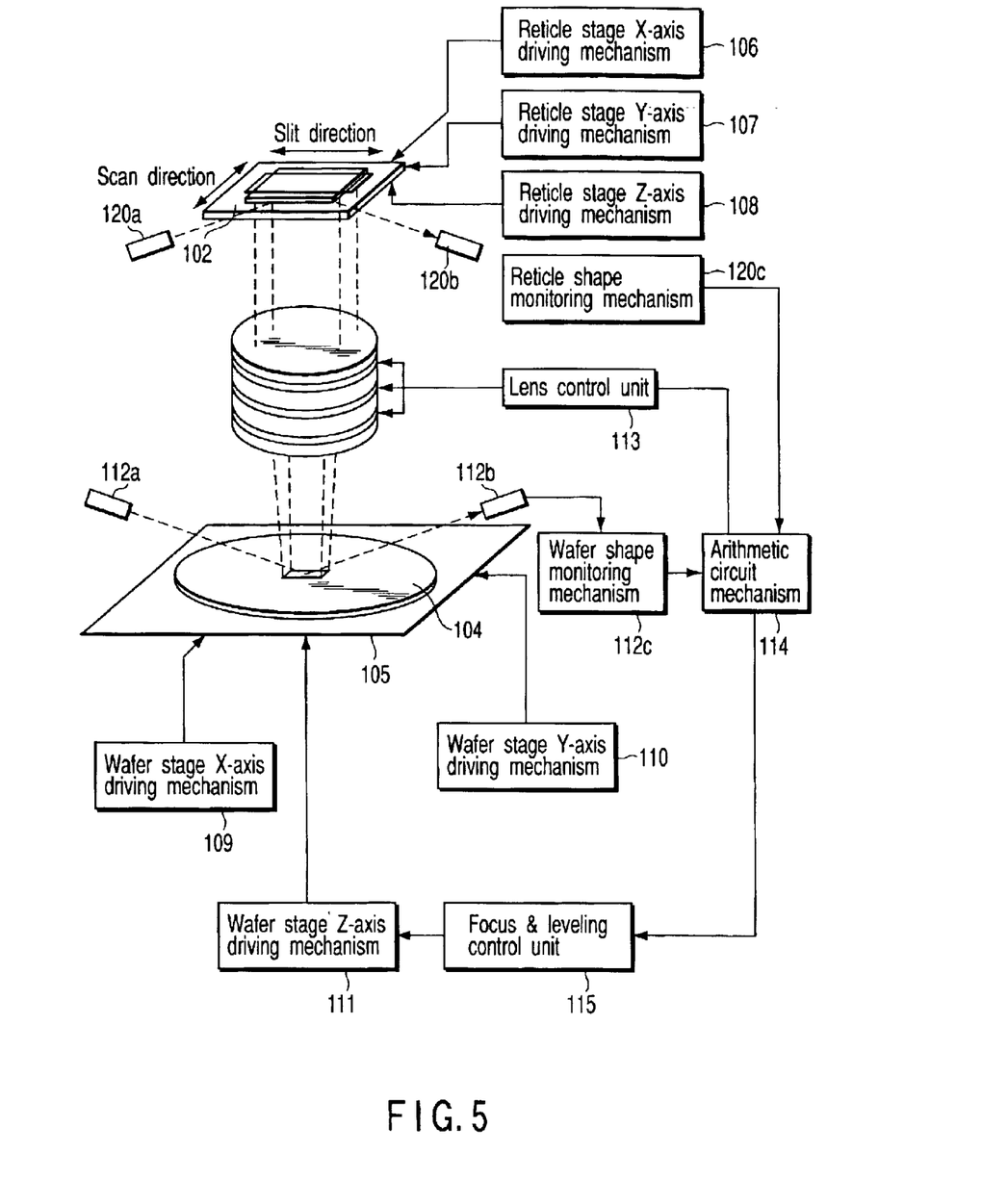
FIG. 5 is a view showing the schematic arrangement of an exposure apparatus according to the first embodiment.

Furthermore, the displacement of a reticle shape at the time of scan exposure may be loaded into the arithmetic circuit mechanism 114 to determine a final lens aberration. FIG. 5 shows the schematic arrangement of an exposure apparatus capable of measuring the displacement of a reticle shape at the time of scan exposure. As shown in FIG. 5, a reticle flatness monitor 120 (120a, 120b, and 120c) measures the displacement of a reticle shape at the time of scanning. The reticle flatness monitor 120 measures the shape of a surface of the reticle which is located on the optical system side. The measurement result is then loaded into the arithmetic circuit mechanism 114, which in turn computes the tilt and curved components of the reticle surface. A final aberration adjustment amount for the projection lens 103 is determined from the computed tilt and curved components. Correction may be made by tilting the reticle stage 102 by using a reticle stage Z-axis driving mechanism 108 on the basis of the tilt component. In addition, since correction can be made including the state of the reticle, higher-precision correction can be made as compared with the apparatus shown in FIG. 1. Note that since the method of computing the tilt and curved components of a reticle surface is the same as the method of computing the tilt and curved components of a measurement area surface, a description thereof will be omitted.

The reticle flatness monitor 120 includes irradiators 120a for emitting illumination light at a plurality of positions in a measurement area surface in number sufficient to grasp a reticle shape in the irradiation area of the reticle 101, and light-receiving units 120b which receive reflected light beams. At this time, it is preferable to monitors, as sensing positions in the exposure area, positions on the reticle and semiconductor wafers which correspond to each other. The reticle flatness monitor 120 further includes a reticle shape monitoring mechanism 120c for measuring information about the height positions of the reticle at the plurality of positions on the measurement area surface, i.e., the positions in the optical axis direction of a light beam (Z-axis direction), from signals representing the respective reflected light beams received by the light-receiving units 120b.

(Second Embodiment)

As an effective method in a case wherein a large focus variation is caused in the apparatus described in the first embodiment by the distortion of a reticle shape, in particular, a method of improving the effective focus variation on a semiconductor wafer surface by adding fine vertical movement mechanisms to a chuck plate for a reticle will be described next.

Figure 6A:
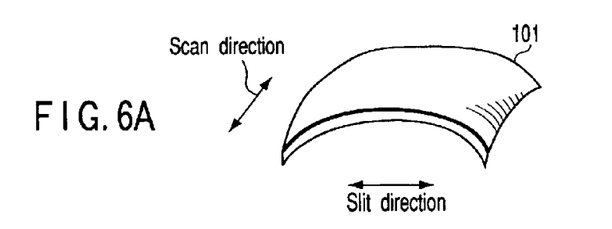
FIGS. 6A to 6C are views showing the shape of a reticle with large distortion when it is chucked according to the second embodiment.
Figure 6B:
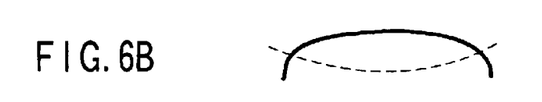
Figure 6C:
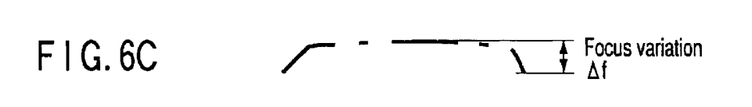

An apparatus having the arrangement shown in FIG. 5 is used. The second embodiment differs from the first embodiment in that when a reticle shape is greatly distorted, a portion that cannot be corrected by the above aberration adjustment exists. FIGS. 6A to 6C show a reticle shape when the above greatly distorted reticle is chucked. As shown in FIG. 6A, after the reticle is chucked, its shape greatly deforms at the ends of the reticle. This deformation exceeds the allowable range of aberration adjustment. FIG. 6B shows the focus variation residual when tilt correction and aberration adjustment are done with respect to the distortion of the reticle shape by using the method according to the first embodiment. Referring to FIG. 6B, the solid line indicates the focus variation residual due to reticle shape distortion which is obtained after tilt correction for the semiconductor wafer. Referring to FIG. 6B, the dotted line indicates the limit correction amount obtained by making aberration adjustment to minimize the residual. FIG. 6C shows the total result based on the characteristics represented by the dotted line and solid line, i.e., the focus aberration residual after tilt correction and aberration adjustment are done for the reticle distortion.

As is obvious from the above description, if a reticle shape is poor, and more specifically, a large shape deterioration has occurred at the end portions of the reticle, a focus variation $\Delta f$ remains as a curved component that cannot be completely corrected by aberration adjustment alone.

For this reason, movement mechanisms which are made of PZT or the like and can finely move vertically are attached to a chuck plate for holding a reticle. By using such fine vertical movement mechanism, a curved component of a focus variation which cannot be corrected by aberration adjustment alone can be corrected.

Figure 7A:
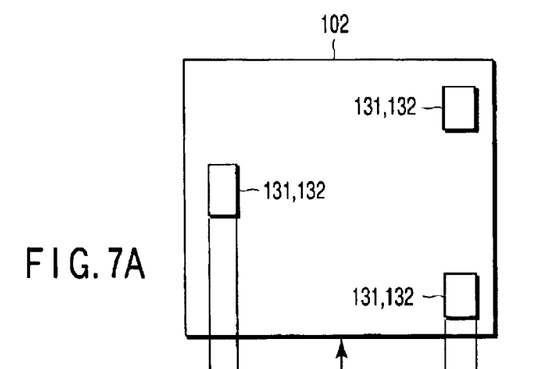
FIGS. 7A to 7C are views showing a reticle stage, chucks, and fine vertical movement mechanisms arranged on the lower portion of each chuck according to the second embodiment.
Figure 7B:
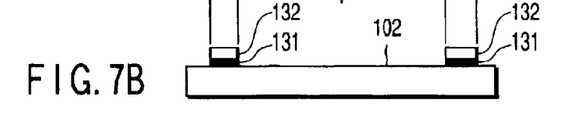
Figure 7C:
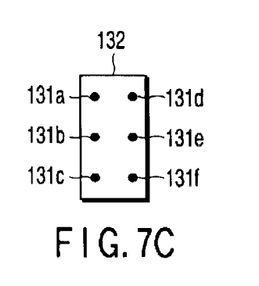
Figure 8A:
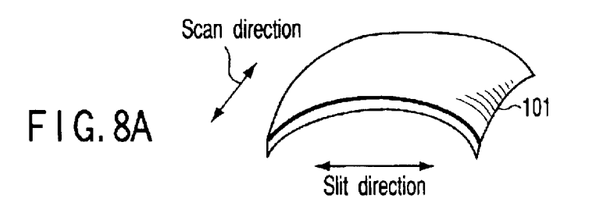
FIGS. 8A and 8B are views showing how a reticle is distorted by the fine vertical movement mechanisms on the lower portion of each chuck.
Figure 8B:
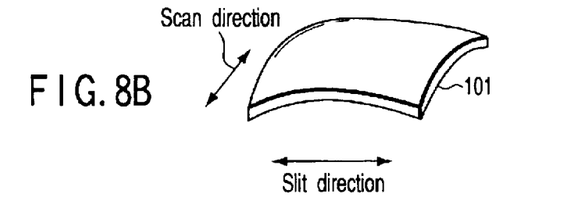

FIGS. 7A and 7B show a reticle stage, chucks, and fine vertical movement mechanisms mounted on the lower portion of the chucks. FIG. 7A is a plan view showing the arrangement of a reticle and chucks. FIG. 7B is a side view in the direction indicated by the arrow in FIG. 7A. FIG. 7C is a plan view showing the arrangement of chucks and fine vertical movement mechanisms.

As shown in FIGS. 7A and 7B, a chuck 132 is mounted on a reticle stage 102 via a fine vertical movement mechanism 131. As shown in FIGS. 7B and 7C, six fine vertical movement mechanisms 131a to 131f are arranged on the lower portion of each chuck 132.

A focus control method using the fine vertical movement mechanisms on the lower portion of each chuck in FIGS. 7A and 7B will be described with reference to FIGS. 8A, 8B, and 8A to 9C.

First of all, an operator moves a total of 18 fine vertical movement mechanisms 131 while observing a reticle shape with a reticle flatness monitor 120 in FIG. 5, thereby making adjustment to set the distortion of a reticle 101 within a region where it can be corrected by aberration adjustment. As a result of adjustment, the surface shape of the reticle 101 after reticle chucking is set in a state wherein the focus variation can be sufficiently corrected by aberration adjustment like that shown in FIGS. 8A and 8B.

Figure 9A:
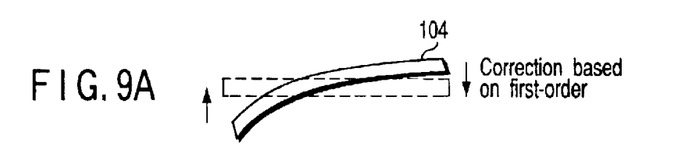
FIGS. 9A to 9C are views for explaining an exposure method using the fine vertical movement mechanisms on the lower portion of each chuck.
Figure 9B:
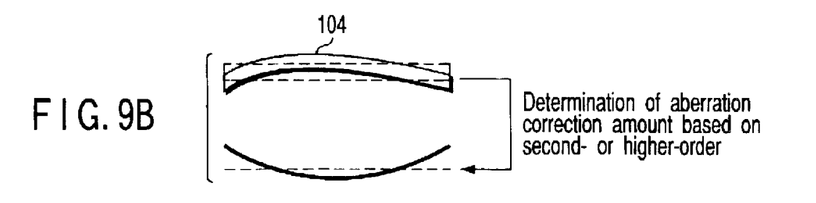
Figure 9C:
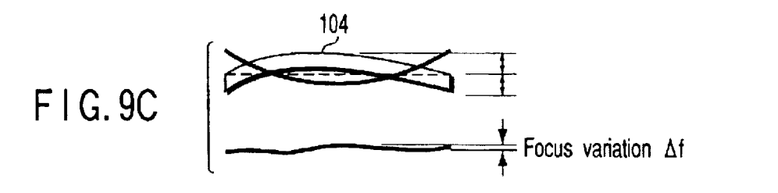

Control is then performed in accordance with the procedure in the first embodiment. The semiconductor wafer shape (level difference information) of an area to be exposed (measurement area surface) is measured by a look-ahead focus sensor 112. An arithmetic circuit mechanism 114 computes tilt and curved components on the basis of the measured data. Tilt correction is then performed in accordance with the tilt component (FIG. 9A). The arithmetic circuit mechanism 114 also determines an appropriate aberration adjustment amount in the slit direction from the obtained curved component (FIG. 9B). A lens control unit 113 performs aberration adjustment for the projection lens on the basis of the obtained aberration adjustment amount (FIG. 9C), thereby executing exposure.

With regard to correction of a tilt amount, a focus & leveling control unit 115 causes a semiconductor wafer stage Z-axis driving mechanism 111 to control and correct the tilt of a semiconductor wafer stage 105 during exposure by the same method as that used in the prior art.

In this case, six fine vertical movement mechanisms are provided for each chuck. However, the number of fine vertical movement mechanisms is not limited to six. In addition, fine vertical movement mechanisms may be mounted at positions, other than positions on a reticle chuck portion, at which the distortion characteristics of a reticle surface shape can be changed.

As shown in FIGS. 8A and 8B and 9A to 9C, by using the above method, a second- or higher-order curved component which cannot be corrected in the prior art can be corrected, and the focus variation Δf in an exposure area can be greatly reduced. This makes it possible to accurately obtain focus even on an area on a peripheral portion of a semiconductor wafer which cannot be used in the prior art because of poor semiconductor wafer flatness, thus achieving an increase in yield and a reduction in manufacturing cost.

(Third Embodiment)

In the third embodiment, a control method of improving the throughput by effectively performing the methods according to the first and second embodiments will be described below. In the first and second embodiments, the heavy load imposed on the arithmetic circuit mechanism 114 is a factor that decreases the throughput.

Under the circumstances, the present inventor has contrived a technique of storing data obtained in advance by measurement as flatness data about semiconductor wafers and using the stored data. This technique will be described in detail below.

A focus control procedure will be described below with reference to FIG. 10.

(Step S201)

First of all, shape data about a semiconductor wafer to be exposed is acquired in advance. In this embodiment, semiconductor wafer flatness data is obtained in advance by using a semiconductor wafer flatness measurement apparatus (NIWF-300) available from Nikon which can measure flatness in the same chucking state as that of the exposure apparatus. Note that the above measurement is executed after it is sufficiently confirmed that a sufficient correlation can be established between the semiconductor wafer flatness data measured by the above semiconductor wafer flatness measurement apparatus and that measured by the exposure apparatus.

Note in particular that it is important that semiconductor wafer shape data to be obtained in advance is measured by a chuck having the same structure as that of an exposure apparatus to be used under the same chucking conditions. If the data measured by a check having a different structure under different chucking conditions is used, no correlation may be obtained with respect to semiconductor wafer flatness in actual exposure operation, resulting in a factor that causes a focus variation. Even if the same conditions cannot be set, the correlation between the two data must be sufficiently checked, and the measured data must be corrected in consideration of the correlation.

(Step S202)

An exposure map is loaded, and scan exposure is started.

(Step S203)

Concurrently with the step S202, the semiconductor wafer flatness data measured in advance is acquired, and shape data in each site is computed.

(Step S204)

Tilt and curved components are computed from the computed shape data.

(Steps S205 and S206)

Leveling amounts are sequentially determined from the tilt components in the respective exposure sites, and aberration adjustment amounts are determined from the curved components.

Correction is made on the basis of the leveling amounts and aberration adjustment amounts in the respective exposure sites.

In this case, in order to improve the processing efficiency, calculations in steps S203 to S205 and S206 may be concurrently performed during exposure on the first semiconductor wafer to prepared for exposure on the next semiconductor wafer. This makes it possible to increase the throughput.

Figure 10:
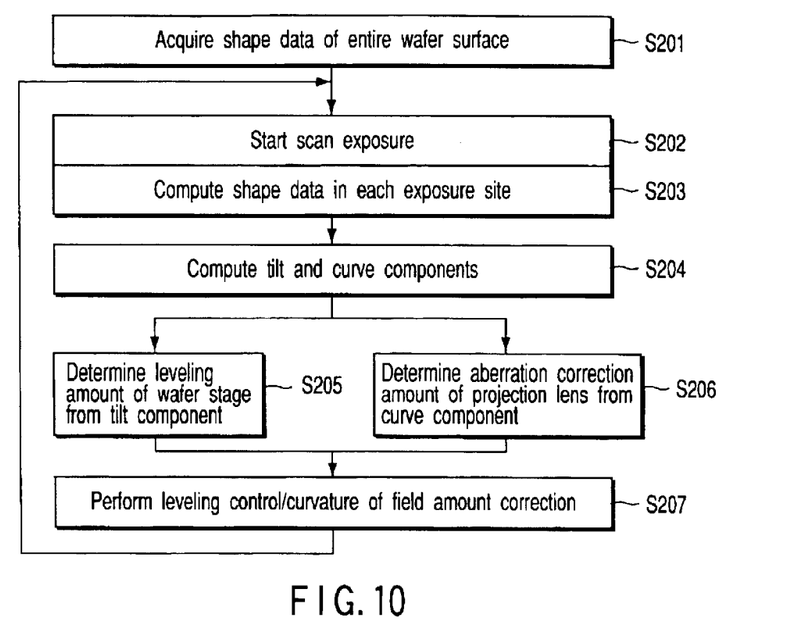
FIG. 10 is a flow chart for explaining an exposure method according to the third embodiment.

By using the above method, as shown in FIG. 10, since additional processing with respect to the conventional exposure processing can be performed during exposure, a curved component which cannot be corrected in the prior art can be corrected, and the focus variation Δf in the exposure area can be greatly reduced without decreasing the throughput. This makes it possible to accurately obtain focus even on an area on a peripheral portion of a semiconductor wafer which cannot be used in the prior art because of poor semiconductor wafer flatness, thus achieving an increase in yield and a reduction in manufacturing cost.

Steps S203 to S205 and S206 can be done by using an arithmetic apparatus independent of exposure processing. In addition, if computation results are stored in a database, and the exposure apparatus executes exposure by reading out the data, the computation processing time can be shortened. This further increases the throughput.

As an apparatus for measuring shape data about a semiconductor wafer surface in advance, a measurement apparatus which can measure data with a sufficient correlation with the semiconductor wafer surface shape detected by the exposure apparatus may be used. A general flatness measurement apparatus may be used, or the auto focus function of the exposure apparatus may be directly used.

Although not described in detail, it is obvious that data about the flatness of a reticle can be acquired in advance and processed together with semiconductor wafer flatness information.

This embodiment is based on a scan exposure apparatus, and tilt and curved components in the slit direction are corrected. However, similar correction can also be made in the scan direction, as needed. In addition, as far as a block exposure apparatus is concerned, effective operation can be done by performing aberration adjustment in both the X direction and the Y direction, and the same effects as those described above can be obtained.

Note that the present invention is not limited to the above embodiments, and can be variously modified in the execution stage within the spirit and scope of the invention. The above embodiments include inventions of various stages, and various inventions can be extracted by proper combinations of a plurality of disclosed constituent elements. When, for example, the problems described in "BACKGROUND OF THE INVENTION" can be solved and the effects described in "BRIEF SUMMARY OF THE INVENTION" can be obtained even if several constituent elements are omitted from all the constituent elements in each embodiment, the arrangement from which these constituent elements are omitted can be extracted as an invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An exposure method of performing scan exposure on an exposure area on a wafer by moving the wafer with respect to exposure light passing through an optical system in synchronism with movement of a reticle with respect to the exposure light, comprising:

measuring a position distribution, in an optical axis direction of the optical system, on a measurement area surface of the wafer which is not irradiated with the exposure light;

computing a tilt component and a curved component of the measurement area surface on the basis of the measured position distribution;

obtaining a leveling amount by which the measurement area surface is made to become orthogonal to the optical axis direction, on the basis of the tilt component;

obtaining an adjustment amount for an imaging characteristic of the optical system on the basis of the curved component; and irradiating the measurement area with the exposure light on the basis of the obtained leveling amount and adjustment amount while the measurement area surface and the imaging characteristic are adjusted.

2. A method according to claim 1, wherein the imaging characteristic is adjusted by adjusting a curvature-of-field characteristic.

3. A method according to claim 1, wherein the imaging characteristic is adjusted in a direction in which the curved component of the measurement area is canceled out.

4. A method according to claim 1, wherein the position distribution on the measurement area is measured in advance before scan exposure is performed on the wafer.

5. A method according to claim 1, wherein computing the tilt component and the curved component comprises:

representing the measurement area surface by a first-order function on the basis of the position distribution;

representing the measurement area surface by a multi-order function higher than the second order on the basis of the position distribution;

setting a first-order term coefficient of the first-order function as the tilt component; and setting a second- or higher-order term coefficient of the multi-order function as the curved component.

6. A method of manufacturing a semiconductor device, comprising:

preparing a semiconductor wafer; and exposing the semiconductor wafer by using the exposure method defined in claim 1.

7. An exposure method of performing scan exposure on an exposure area on a wafer by moving the wafer with respect to exposure light passing through an optical system in synchronism with movement of a reticle with respect to the exposure light, comprising:

measuring a position distribution, in an optical axis direction of the optical system, on a measurement area surface of the wafer which is not irradiated with the exposure light;

computing a tilt component and a curved component of the wafer surface on the basis of the position distribution on the wafer surface;

measuring a position distribution, in the optical axis direction, on a reticle surface of the reticle which is located on the optical system side;

computing a tilt component and a curved component of the reticle surface on the basis of the position distribution on the reticle surface;

obtaining a leveling amount by which the measurement area surface is made to become orthogonal to the optical axis, on the basis of the tilt component of the measurement area surface;

obtaining at least one of adjustment amounts for imaging characteristic of the optical system and the position of the reticle surface on the basis of curved components of the measurement area surface and the reticle surface; and irradiating the measurement area surface with the exposure light on the basis of the leveling amount and the adjustment amount while the measurement area surface and at least one of the imaging characteristic and the position of the reticle surface are adjusted.

8. A method according to claim 7, wherein a curvature-of-field characteristic is adjusted as the imaging characteristic.

9. A method according to claim 7, wherein the imaging characteristic is adjusted in a direction in which the curved component of the measurement area surface is canceled out.

10. A method according to claim 7, wherein the position distribution on the measurement area surface is measured in advance before scan exposure is performed on the wafer.

11. A method according to claim 7, wherein computing the tilt component and the curved component of the measurement area surface comprises:

representing the measurement area surface by a first-order function on the basis of the position distribution on the measurement area surface;

representing the measurement area surface by a multi-order function higher than the second order on the basis of the position distribution on the measurement area surface;

setting a first-order term coefficient of the first-order function as the tilt component of the measurement area surface; and setting a second- or higher-order term coefficient of the multi-order function as the curved component of the measurement area surface.

12. A method according to claim 7, wherein computing the tilt component and the curved component of the reticle surface comprises:

representing the reticle surface by a first-order function on the basis of the position distribution on the reticle surface;

representing the reticle surface by a multi-order function higher than the second order on the basis of the position distribution on the reticle surface;

setting a first-order term coefficient of the first-order function as the tilt component of the reticle surface; and setting a second- or higher-order term coefficient of the multi-order function as the curved component of the reticle surface.

13. A method of manufacturing a semiconductor device, comprising:

preparing a semiconductor wafer; and exposing the semiconductor wafer by using the exposure method defined in claim 7.

14. An exposure apparatus comprising:

an optical system which projects a pattern image formed on a reticle onto a wafer;

a reticle stage on which the reticle is placed and which can move in a direction perpendicular to an optical axis direction of the optical system;

a wafer stage on which the wafer is placed and, which can move in the optical axis direction of the optical system and a direction perpendicular to the optical axis direction;

wafer surface position measurement means configured to measure a position of the wafer surface in the optical axis direction of the optical system;

a computing mechanism which computes a tilt component and a curved component of the wafer surface on the basis of the measurement value obtained by the wafer surface position measurement means;

adjustment means configured to adjust a position of the wafer in the optical axis direction of the optical system on the basis of the tilt component; and correction means configured to correct an imaging characteristic of the optical system on the basis of the curved component.

15. An apparatus according to claim 14, wherein the correction means corrects a curvature-of-field characteristic.

16. An apparatus according to claim 14, wherein the correction means adjusts the imaging characteristic in a direction in which the curved component of the measurement area surface is canceled out.

17. An exposure apparatus comprising:

an optical system which projects a pattern image formed on a reticle onto a wafer;

a reticle stage which can move in an optical axis direction of the optical system and a direction perpendicular to the optical axis direction;

a vertical movement mechanism which is mounted on the reticle stage and changes a position distribution on the reticle in the optical axis direction of the optical system;

a wafer stage on which the wafer is placed and which can move in the optical axis direction of the optical system and a direction perpendicular to the optical axis direction of the optical system;

wafer surface position measurement means configured to measure a position of a measurement area surface of the wafer in the optical axis direction of the optical system;

reticle surface position measurement means configured to measure a position of the reticle surface located on the optical system side in the optical axis direction;

a first computing mechanism which computes a tilt component and a curved component of the measurement area surface on the basis of the measurement result obtained by the wafer surface position measurement means;

a second computing mechanism which computes a curved component of the reticle surface on the basis of the measurement result obtained by the reticle surface position measurement means;

adjustment means configured to adjust a position of the wafer in the optical axis direction of the optical system on the basis of the tilt component computed by the first computing mechanism; and correction means configured to correct at least one of an imaging characteristic of the optical system and a position distribution on the reticle surface in the optical axis direction on the basis of the curved component computed by the first and second computing mechanisms.

18. An apparatus according to claim 17, wherein the correction means corrects a curvature-of-field characteristic of the optical system.

19. An apparatus according to claim 17, wherein the correction means adjusts the imaging characteristic in a direction in which the curved component of the measurement area surface is canceled out.

* * * * *